(12) United States Patent  (10) Patent No.: US 8,901,802 B1
Que  (45) Date of Patent: Dec. 2, 2014

(54) PIEZOELECTRIC PHOTOVOLTAIC MICROPOWER GENERATOR AND METHOD

(75) Inventor: Long Que, Ruston, LA (US)

(73) Assignee: Louisiana Tech University Research Foundation, a division of Louisiana Tech University Foundation Inc., Ruston, LA (US)

( * ) Notice: Subject to any disclaimer, the term of this patent is extended or adjusted under 35 U.S.C. 154(b) by 226 days.

(21) Appl. No.: 13/085,561

(22) Filed: Apr. 13, 2011

Related U.S. Application Data

(60) Provisional application No. 61/323,395, filed on Apr. 13, 2010.

(51) Int. Cl.
*H01L 41/39* (2013.01)

(52) U.S. Cl.
USPC ............ 310/339; 310/330; 310/331; 310/332

(58) Field of Classification Search
CPC ..... H01L 41/0926; H01L 41/39; H04R 17/00
USPC .................................. 310/339, 330, 331, 332
See application file for complete search history.

(56) References Cited

U.S. PATENT DOCUMENTS

| | | | |
|---|---|---|---|
| 6,407,484 B1 | 6/2002 | Oliver et al. | |
| 7,081,693 B2 | 7/2006 | Hamel et al. | |
| 7,649,305 B2 | 1/2010 | Priya et al. | |
| 2006/0230475 A1* | 10/2006 | Moon et al. | 977/876 |
| 2007/0108068 A1* | 5/2007 | Suh et al. | 205/766 |
| 2008/0174273 A1* | 7/2008 | Priya et al. | 320/114 |
| 2008/0191585 A1* | 8/2008 | Pelrine et al. | 310/363 |
| 2008/0212262 A1* | 9/2008 | Micallef | 361/502 |
| 2009/0079298 A1 | 3/2009 | Park et al. | |
| 2009/0096346 A1* | 4/2009 | Liu et al. | 313/325 |
| 2009/0261689 A1 | 10/2009 | Fang | |
| 2009/0301196 A1* | 12/2009 | Wang et al. | 73/579 |
| 2009/0320225 A1* | 12/2009 | Wu et al. | 15/167.1 |
| 2010/0296677 A1* | 11/2010 | Jiang et al. | 381/190 |
| 2011/0140579 A1* | 6/2011 | Moon et al. | 310/339 |

OTHER PUBLICATIONS

V. Kotipalli, Z. Gong, P. Pathak, T. Zhang, Y. He, S. Yadav, and L. Que, Light and thermal energy cell based on carbon nanotube films, Applied Physics Letters 97, 1-1, American Institute of Physics (2010).
V. Kotipalli, Z. Gong, Y. He, S. Yadav, S. Penmetsa, J. Wei, and L. Que, Carbon Nanotube Film-Based Cantilever for Light and Thermal Energy Harvesting, IEEE Sensors 2010 Conference, 1165-1168 (2010).
Z. Gong, V. Koptipalli, C. O'Neal, and L. Que, A piezoelectric photovoltaic micropower generation (PPVMG) chip, TechConnect World Conference & Expo, Houston, Texas (May 3-7, 2009).

* cited by examiner

*Primary Examiner* — Derek Rosenau
*Assistant Examiner* — Bryan Gordon
(74) *Attorney, Agent, or Firm* — Jones Walker LLP (57) ABSTRACT

An energy harvesting device capable of harvesting multiple forms of energy. The device includes a base, a piezoelectric cantilever, and a carbon nanotube film. The piezoelectric cantilever includes a piezoelectric layer disposed between a top electrode and a bottom electrode. A proximate end of the piezoelectric cantilever is supported by the base. The base does not support a distal end of the piezoelectric cantilever. The piezoelectric cantilever is capable of converting vibration energy into electrical power. The carbon nanotube film is capable of absorbing electromagnetic radiation and thermal radiation, and thereafter transmitting heat to the piezoelectric layer. The piezoelectric layer is mechanically deformed in response to said heating, thereby generating electrical power.

14 Claims, 7 Drawing Sheets

PIEZOELECTRIC PHOTOVOLTAIC MICROPOWER GENERATOR AND METHOD

CROSS-REFERENCE TO RELATED PATENT APPLICATIONS

This application claims priority to U.S. Provisional Application No. 61/323,395, filed on Apr. 13, 2010, which is incorporated herein by reference.

BACKGROUND

Increasing energy demands have driven increased interest in the development of alternative energy technology. Renewable energies are attractive alternative energy sources due to their cleanness and unlimited availability. Renewable energies include solar energy, thermal radiation energy, and various vibration energies.

Piezoelectric materials have been used to harvest vibration energy from the environment. Applying a mechanical stress to a piezoelectric material produces electric polarization in the material resulting in the generation of a voltage across the piezoelectric material. Piezoelectric electromechanical transducers convert mechanical energy to electrical energy. MEMS (microelectromechanical systems) piezoelectric cantilever devices capture environmental vibration energy and convert it to electrical energy. MEMS are very small devices having overall sizes ranging from twenty micrometers to one millimeter. The components of MEMS devices are usually between one and one hundred micrometers in size.

Photovoltaic cells convert solar energy into electrical energy. However, existing photovoltaic cells have low efficiencies. For example, commercially available single crystal silicon-based photovoltaic devices convert solar energy into electrical power with efficiencies of only fifteen percent.

Carbon nanotube films exhibit near blackbody properties. Carbon nanotubes efficiently absorb electromagnetic radiation and convert it into heat.

Each of the existing technologies for harvesting renewable energies is only capable of absorbing one form of energy. Photovoltaic cells convert solar energy into electrical energy, while aligned zinc oxide nanowire arrays and MEMS piezoelectric cantilever devices convert mechanical energy into electrical energy.

SUMMARY OF SELECTED EMBODIMENTS OF INVENTION

In one embodiment, an energy harvesting device capable of harvesting multiple forms of energy may include a piezoelectric cantilever capable of converting vibration energy into electrical power. The device may also include a carbon nanotube film. The carbon nanotube film may be operatively associated with the piezoelectric cantilever. In a more preferred embodiment, the carbon nanotube film may be disposed above the piezoelectric cantilever. The energy harvesting device may be capable of converting electromagnetic radiation and thermal radiation into electrical power by the carbon nanotube film's absorption of these energies.

After the carbon nanotube film absorbs electromagnetic and thermal radiation, the carbon nanotube film may transmit heat to the piezoelectric cantilever, mechanically deforming the piezoelectric cantilever, and thereby generating electrical power in response to the mechanical deformation. The piezoelectric cantilever may include a base, a first electrode operatively associated with the base, a second electrode operatively associated with the first electrode, and a piezoelectric layer disposed between the first and second electrodes. The energy harvesting device may be capable of generating continuous power upon a self-reciprocation of the piezoelectric cantilever with the carbon nanotube film.

In another embodiment, an energy harvesting device capable of harvesting multiple forms of energy may include a base, a piezoelectric cantilever operatively associated with the base, and a carbon rod film operatively associated with the piezoelectric cantilever. The piezoelectric cantilever may include a piezoelectric layer disposed between a first electrode and a second electrode. The first electrode may be operatively associated with the base, and the second electrode may be operatively associated with the carbon rod film.

In yet another embodiment, an arrayed energy harvesting chip may include a plurality of energy harvesting devices positioned on a host chip. The energy harvesting device may include a plurality of piezoelectric cantilevers and a plurality of carbon nanotube films operatively associated with each of the plurality of piezoelectric cantilevers. The piezoelectric cantilevers with the associated carbon nanotube films may be incorporated onto a single chip.

In still another embodiment, a self-powered MEMS system may include an energy harvesting device, a power storage device, and an electronic device.

In a further embodiment, a method for generating electricity by harvesting multiple forms of energy may include providing an energy harvesting device. The device may include a piezoelectric cantilever and a carbon nanotube film operatively associated with the piezoelectric cantilever. The method may also include exposing the carbon nanotube film to electromagnetic radiation and thermal radiation. The method may further include causing the carbon nanotube film to heat the piezoelectric cantilever, thereby causing mechanical deformation of the piezoelectric cantilever. The method may also include absorbing vibration energy with the piezoelectric cantilever in the form of mechanical deformation of the piezoelectric cantilever. The method may include generating electrical power with the piezoelectric cantilever in response to the mechanical deformation of the piezoelectric cantilever due to heating by the carbon nanotube film and the absorption of vibration energy. The method may further include collecting the electrical power from the piezoelectric cantilever.

BRIEF DESCRIPTION OF THE SEVERAL VIEWS OF THE DRAWINGS

In consideration of the following detailed description, various embodiments are described in connection with the following drawings.

DETAILED DESCRIPTION OF THE SELECTED EMBODIMENTS

Figure 1:
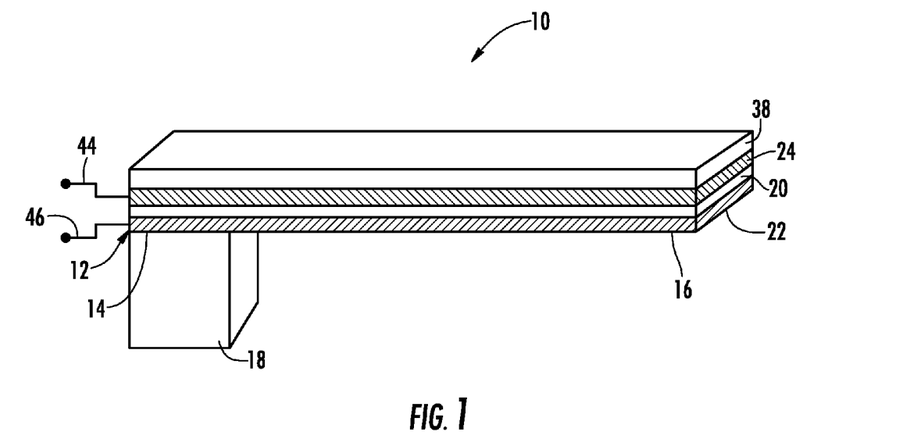
FIG. 1 is a perspective view of an embodiment of an energy harvesting device.
Figure 2:
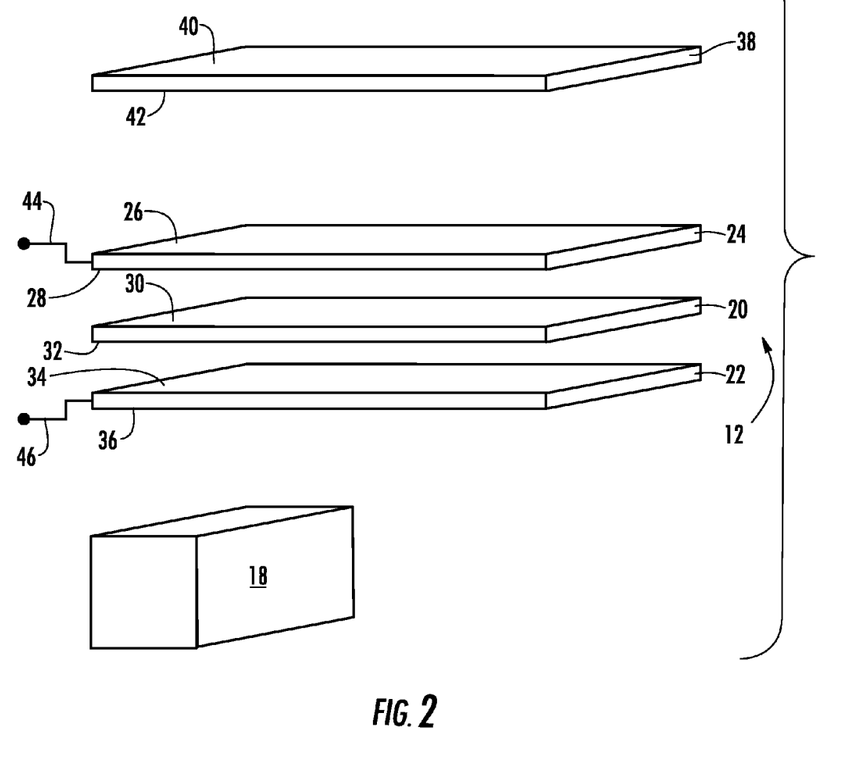
FIG. 2 is an exploded view of the energy harvesting device of FIG. 1.

As illustrated in FIGS. 1 and 2, one embodiment of energy harvesting device 10 may include piezoelectric cantilever 12. Piezoelectric cantilever 12 may have proximate end 14 and distal end 16. Proximate end 14 may be supported by base 18, while distal end 16 may be unsupported. A cantilever is a projecting beam or structure supported only at one end. A piezoelectric cantilever is a cantilever structure that includes at least one layer of piezoelectric material, but may also include layers of other materials. In the embodiment shown in FIGS. 1 and 2, piezoelectric cantilever 12 includes piezoelectric layer 20, bottom electrode 22, and top electrode 24.

Piezoelectric layer 20 and bottom and top electrodes 22, 24 may have similar shapes. Top electrode 24 may have upper surface 26 and lower surface 28. Piezoelectric layer 20 may have upper surface 30 and lower surface 32. Bottom electrode 22 may have upper surface 34 and lower surface 36. Upper surface 34 of bottom electrode 22 may be operatively associated with lower surface 32 of piezoelectric layer 20. Upper surface 30 of piezoelectric layer 20 may be operatively associated with lower surface 28 of top electrode 24. In one embodiment, operatively associated means in direct contact or directly connected. However, operatively associated may have different meanings in other embodiments.

Device 10 may also include carbon nanotube film 38 disposed above piezoelectric cantilever 12. In one embodiment, disposed above means positioned such that all portions of the object are at a higher position than another object. However, disposed above may have different meanings in other embodiments.

In one embodiment, carbon nanotube film 38 may have the same length and width as piezoelectric cantilever 12. In other embodiments, carbon nanotube film 38 may have a different length and width than piezoelectric cantilever 12. In one embodiment, carbon nanotube film 38 contains only carbon nanotubes. However, in other embodiments, carbon nanotube film 38 may contain carbon nanotubes and one or more other components. In other embodiments, film 38 may instead contain carbon rods, or a mixture of carbon nanotubes and carbon rods.

Carbon nanotube film 38 may have upper surface 40 and lower surface 42. Lower surface 42 of carbon nanotube film 38 may be operatively associated with upper surface 26 of top electrode 24. First electrical connection 44 may be operatively connected to top electrode 24. Second electrical connection 46 may be operatively connected to bottom electrode 22.

In one embodiment, piezoelectric layer 20 is composed of any piezoelectric material, such as lead zirconate titanate. Top and bottom electrodes 24, 22 may be composed of any conductive material, including nickel, platinum, chrome, gold, or silver. Base 18 may be silicon, glass, plastic, or any other suitable substrate material. Table 1 sets forth the coefficient of thermal expansion values for some materials that may be included in device 10.

TABLE 1

Coefficient of Thermal Expansion Values

| MATERIAL | COEFFICIENT OF THERMAL |
|---|---|
| Pure Nickel | 13 |
| Pure Platinum | 8.8-9.1 |
| Lead zirconate titanate | 2.5-4.1 |
| Pure silicon | 2.6-3.3 |

Carbon nanotube film 38 may have a thickness of approximately 30 micrometers (μm). In one embodiment, device 10 may be approximately 25 millimeters (mm) long, 8 mm wide, and 270 μm thick. However, in other embodiments, device 10 may scaled up to having dimensions in the order of centimeters in length and width. Other embodiments may instead include a scaled down size of device 10, such as dimensions in the order of hundreds of micrometers in length and width. In other embodiments, device 10 may have a thickness in the order of tens or hundreds of micrometers. Embodiments of device 10 having scaled-down dimensions may be used in connection with MEMS devices.

Because proximate end 14 is supported by base 18 while distal end 16 is unsupported, piezoelectric cantilever 12 bends in response to vibration energy. This mechanical deformation of piezoelectric layer 20 creates an electric potential across piezoelectric layer 20 due to the chemical properties of piezoelectric layer 20. Using this electric potential, top and bottom electrodes 24, 22 transmit electrical power away from piezoelectric cantilever 12 through first and second electrical connections 44, 46. In this way, piezoelectric cantilever converts vibration energy into electrical energy as understood by those skilled in the art.

Carbon nanotube film 38 efficiently absorbs electromagnetic radiation (including solar radiation) and thermal radiation to which it is exposed. The efficiency of absorption of electromagnetic radiation and thermal radiation may be greater than 90%. Carbon nanotube film 38 is able to absorb electromagnetic radiation at angles other than 90 degrees. In an experiment with light illuminating perpendicularly on a 30 μm thick carbon nanotube film surface, the measured reflectance of light was approximately 9%. In the same experiment, the measured reflectance from the same carbon nanotube film at different incident angles was approximately 3%.

After absorbing electromagnetic radiation and thermal radiation, carbon nanotube film 38 serves as a microheater by transmitting heat to piezoelectric layer 20. The difference in the coefficient of thermal expansion among layers of piezoelectric cantilever 12 causes bending of piezoelectric layer 20. As stated above, the mechanical deformation of piezoelectric layer 20 creates an electric potential across piezoelectric layer 20. Top and bottom electrodes 24, 22 transmit electrical power through first and second electrical connections 44, 46 using this electric potential. In this way, device 10 converts electromagnetic radiation and thermal radiation into electrical energy. Device 10 is capable of continuously harvesting these three forms of energy (i.e., vibration energy, electromagnetic radiation, and thermal radiation). The voltage generated by device 10 may be 3-8 volts (V) when exposed to electromagnetic radiation, thermal radiation, and vibration energy.

Further experimentation revealed that in some embodiments, self-reciprocation of piezoelectric cantilever 12 and carbon nanotube film 38 was observed upon exposing carbon nanotube film 38 to light and thermal radiation. A large displacement of piezoelectric cantilever 12 and carbon nanotube film 38 was observed after the light and/or thermal radiation sources were turned on. As the light and/or thermal radiation sources remained on, a decrease in the displacement was observed, then self-reciprocation of piezoelectric cantilever 12 and carbon nanotube film 38 was observed. When the light and/or thermal radiation sources were turned off, another large displacement of piezoelectric cantilever 12 and carbon nanotube film 38 was observed before the displacement became zero. An Olympus TL-2 lamp was used as the light and thermal radiation source. Systematic experimentation showed that the self-reciprocation continues for the duration of time that the light and/or thermal radiation source remained on. The self-reciprocation of piezoelectric cantilever 12 and carbon nanotube film 38 indicated cyclic bending of piezoelectric cantilever 12 and carbon nanotube film 38. It also indicated the capacity of device 10 for continuous energy generation without consuming other additional energies to modulate light and thermal radiation to actuate and bend piezoelectric cantilever 12 and carbon nanotube film 38. The self-reciprocation was attributed to the high electrical conduction and rapid thermal dissipation by carbon nanotube film 38 to the environment, and continuous absorption of photons by carbon nanotube film 38 from the light and thermal radiation source.

Experiments have also shown the same pattern with the measured open circuit voltage of device 10, namely, a large voltage after the light and/or thermal radiation source was turned on, then a drop in voltage before voltage fluctuations due to the cyclic bending of piezoelectric cantilever 12 and carbon nanotube film 38, a large voltage after the light and/or thermal radiation source was turned off before the voltage became zero. The voltage fluctuations indicated continuous power generation for the duration of time the light and/or thermal radiation source was on. In some embodiments, the voltage generated by device 10 may be as much as 10V when exposed to electromagnetic radiation, thermal radiation, and vibration energy.

Experimental measurements were taken of the output power on a load resistor using a rectifier circuit. Maximum power of approximately 2.1 microwatts (µW) at a corresponding load resistor resistance of 80 megaohms (MΩ) was obtained with a light intensity of 0.13 W/cm$^2$ and thermal radiation (temperature change) of 22 degrees Celcius from the lamp. The generated power of approximately 2.1 µW is sufficient to operate low-power very large scale integration digital circuits and microsensors.

Figure 3:
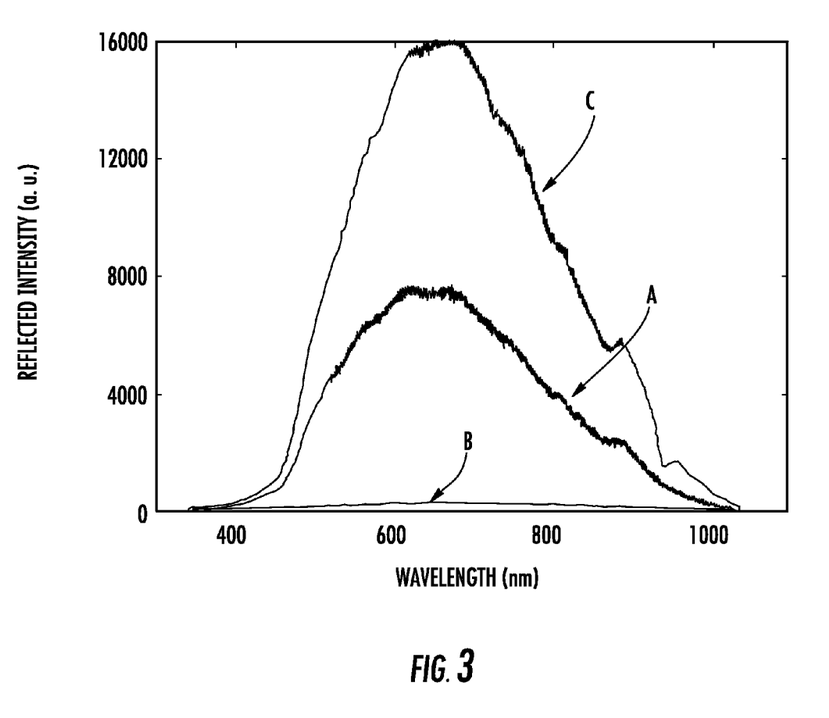
FIG. 3 is a diagram showing the measured reflectance intensity from bare silicon and a carbon nanotube film on silicon, along with the measured intensity of the optical source.

Carbon nanotube film 38 exhibits near blackbody properties. FIG. 3 displays the measured reflectance of light having wavelengths between 400 nm and 1000 nm from bare silicon (curve A) and from carbon nanotube film 38 having a thickness of thirty (30) micrometers on silicon (curve B). FIG. 3 also displays the measured intensity of the light source (curve C). Carbon nanotube film 38 reflected negligible amounts of light (curve B in FIG. 3), signaling that carbon nanotube film 38 absorbs electromagnetic radiation having wavelengths between 400 nm and 1000 nm with high efficiency.

Figure 4:
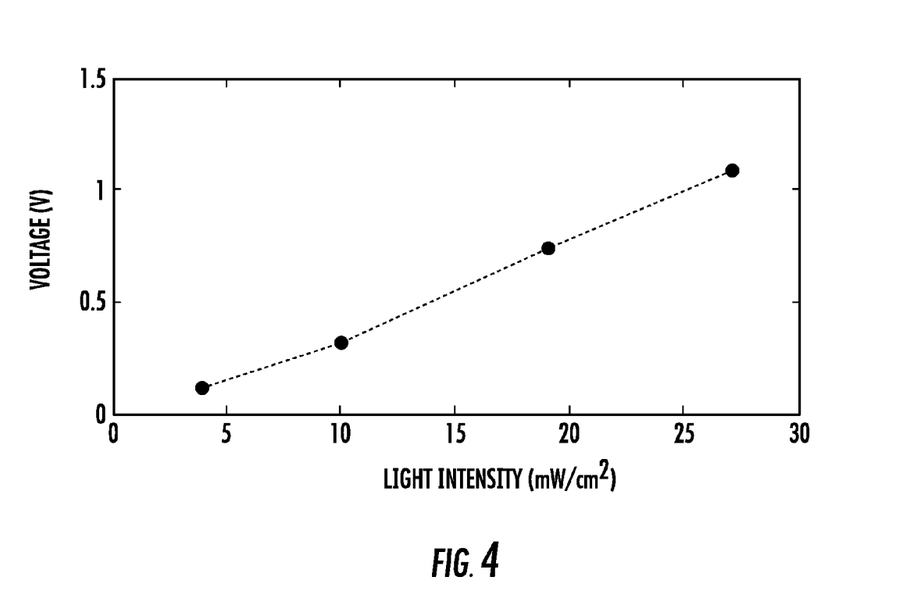
FIG. 4 is a diagram showing the measured maximum voltage generated by the energy harvesting device versus light intensity.
Figure 5:
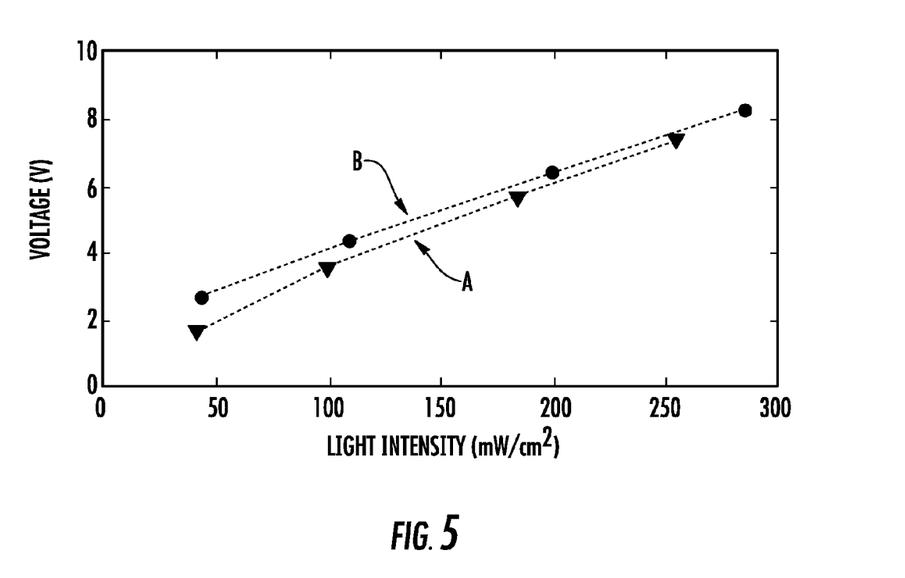
FIG. 5 is a diagram showing the measured maximum voltage generated by the energy harvesting device versus light intensity.

FIGS. 4 and 5 display the measured voltage generated by energy harvesting device 10 under differing conditions. In an experimental test, an Olympus TL-2 lamp with variable intensities was used to gather data. FIG. 4 displays the measured voltage generated by device 10 upon exposure to light energy with intensities varying from 4 mW/cm$^2$ to 27 mW/cm$^2$. The voltage generated by device 10 increased as the intensity of the light source increased, signaling that device 10 converted light energy into electrical power.

Curve A in FIG. 5 displays the measured voltage generated by device 10 when exposed to light energy and thermal radiation. The voltage generated by device 10 increased as the intensity of light, and the thermal radiation from the light source, increased from 45 mW/cm$^2$ to 250 mW/cm$^2$. This increase in voltage generated by device 10 signals that device 10 converted light energy and thermal radiation into electrical power.

Curve B in FIG. 5 displays the measured voltage generated by device 10 when exposed to light energy, thermal radiation, and vibration energy. The voltage generated by device 10 increased as the intensity of light increased from 45 mW/cm$^2$ to 250 mW/cm$^2$. The fact that Curve B displays higher measured voltage values than Curve A at each light intensity value demonstrates that device 10 also converted vibration energy into electrical energy in Curve B.

Figure 6:
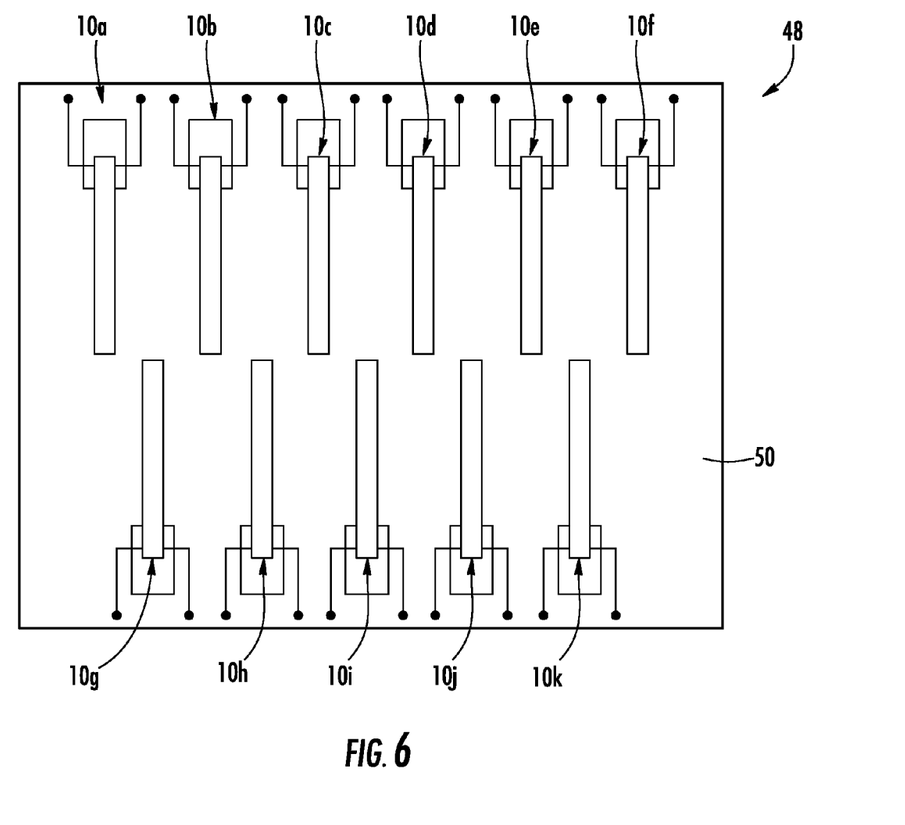
FIG. 6 is a schematic view of an arrayed energy harvesting chip.

FIG. 6 illustrates an arrayed energy harvesting chip 48. Arrayed chip 48 further enhances power generation by incorporating a plurality of energy harvesting devices 10a-10k onto a single chip 50. In one embodiment, a chip may be any structure capable of supporting a plurality of energy harvesting devices 10. In other embodiments, a chip may be a different structure. In one embodiment, chip 50 may be composed of silicon, glass, plastic, or SU-8. However, in other embodiments, chip 50 may be composed of other materials. In one embodiment, the dimensions of chip 50 may be in the order of one hundred micrometers long, tens of micrometers wide, and ten micrometers thick. In this embodiment, several hundreds of arrayed chips 48 may be fabricated on a single wafer. In other embodiments, chip 50 may have different dimensions to accommodate different applications.

Device 10 or arrayed chip 48 may be used with laptop or desk top computers to harvest thermal radiation and vibration energy from the computers in order to recharge the computer battery. Device 10 or arrayed device 48 may be used as power sources of remotely located sensing systems or implanted biomedical devices and systems. Device 10 or arrayed device 48 may be used for wireless sensors of pervasive networks and computer nodes. Device 10 or arrayed device 48 may be integrated with a microsensor, a microsystem, or a nanosystem as a self-power source. Device 10 or arrayed device 48 may also be used to operate integrated circuits such as low-power very large scale integration (VLSI) digital circuits. Device 10 or a plurality of devices 10 may be fabricated with microsensors, microsystems, nanosystems, and/or integrated circuits on a single chip for self-powering capability.

Figure 7:
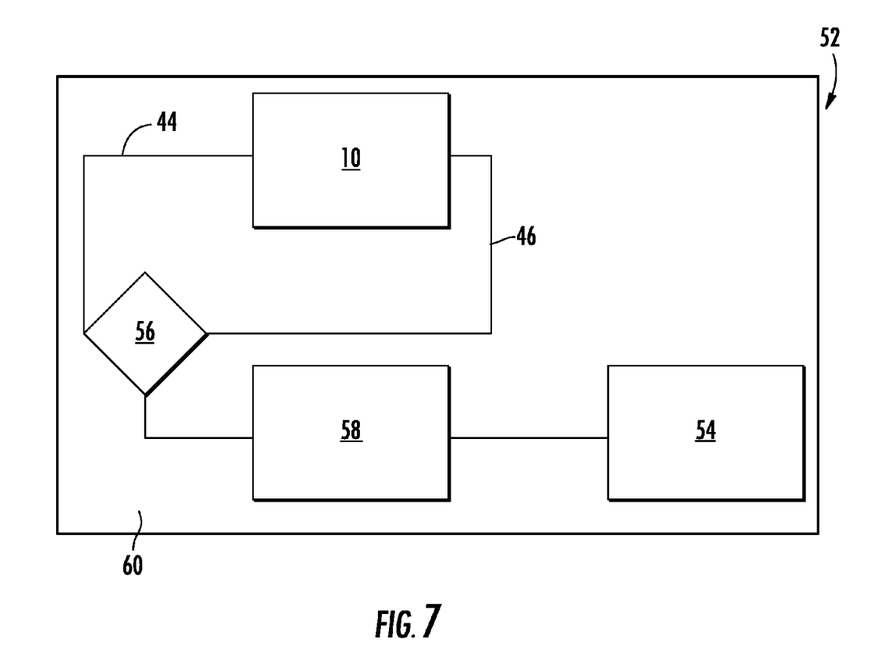
FIG. 7 is a schematic view of a self-powered MEMS system containing an energy harvesting device for powering a microsensor.

FIG. 7 illustrates one embodiment of a self-powered MEMS system 52 containing energy harvesting device 10 for powering microsensor 54. In one embodiment, device 10 generates alternating current electrical power through first electrical connection 44 and second electrical connection 46. Rectifier 56 may convert the alternating current electrical power into direct current electrical power, which may be collected in power storage unit 58. In one embodiment, power storage unit 58 may be a battery. However, in other embodiments, power storage unit 58 may be any other device capable of storing power. Stored electrical energy in power storage unit 58 may power microsensor 54. Device 10, rectifier 56, power storage unit 58, and microsensor 54 may all be contained on a single host chip 60. In another embodiment, device 10 may be connected to a circuit for generation of direct current electrical power. In other embodiments, system 52 may include any LED or electronic device capable of being powered by device 10.

FIGS. 8A-8F are cross-sectional illustrations of the process of fabricating energy harvesting device 10. A carbon nanotube powder may be mixed with a carrier fluid, such as isopropyl alcohol. In one embodiment, the carbon nanotubes may be single wall carbon nanotubes such as those available from Carbon Solutions, Inc. In other embodiments, the carbon nanotubes may be multi-walled carbon nanotubes. In still other embodiments, carbon rods may be used in place of carbon nanotubes.

Figure 8A:
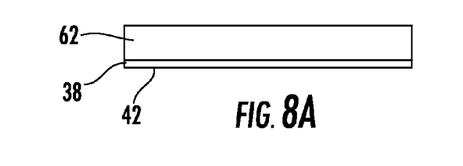
FIGS. 8A-8F are cross-sectional views of the process of fabricating an embodiment of the energy harvesting device.
Figure 8B:
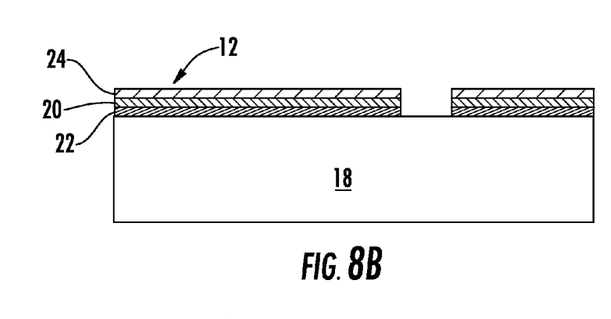
Figure 8C:
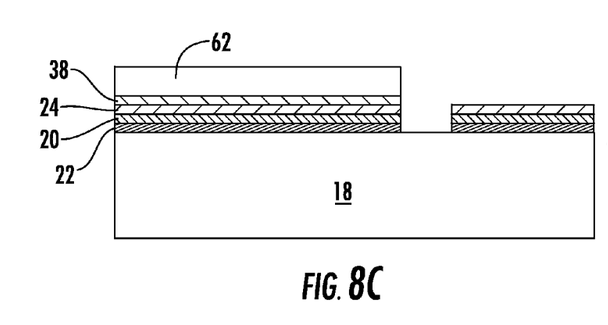

Carbon nanotube film 38 may be formed by separating the solution by vacuum filtration. A mixed cellulose ester filter may be used for vacuum filtration. FIG. 8A illustrates carbon nanotube film 38 and filter 62 used in vacuum filtration. Piezoelectric cantilever 12 may be purchased as a unit in which top and bottom electrodes 22, 24 are bound to piezoelectric layer 20. These units are available through CTS Corporation. Piezoelectric cantilever 12 may be bonded to an upper surface of base 18 using tape or another adhesive mechanism as shown in FIG. 8B. Lower surface 42 of carbon nanotube film 38 (along with filter 62) may be attached to upper surface 26 of top electrode 24 using tape or another adhesive mechanism as illustrated in FIG. 8C. Filter 62 may be removed by dissolving filter 62 with acetone or another solvent in which filter 62 is soluble.

Figure 8D:
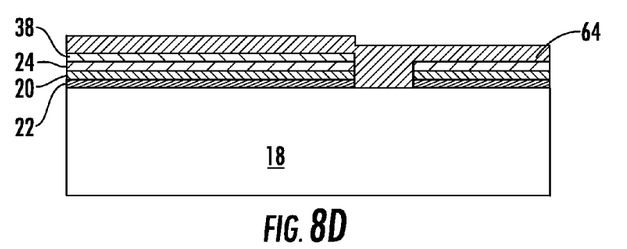
Figure 8E:
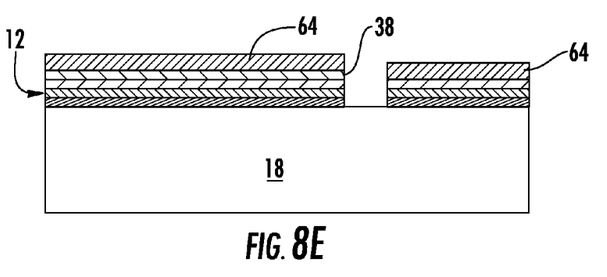
Figure 8F:
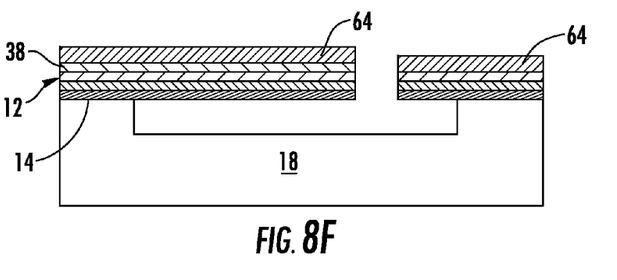

Photoresist layer 64 may be applied to the upper surface of the fabrication complex as shown in FIG. 8D. Photoresist layer 64 may be composed of an SU-8 material. Conventional photolithography may be used to chemically alter a portion of photoresist layer 64 such that the chemically altered portion of photoresist layer 64 is soluble in a photoresist developer. The photoresist developer may then be used to remove the chemically-altered portion of photoresist layer 64 such that a portion of the surface of base 18 is exposed as shown in FIG. 8E. A dry etching process using xenon difluoride may then be used to remove a portion of base 18 from below piezoelectric cantilever 12 such that proximate end 14 is supported by base 18 while distal end 16 is unsupported as shown in FIG. 8F.

The embodiments shown in the drawings and described above are exemplary of numerous embodiments that may be made within the scope of the appended claims. It is contemplated that numerous other configurations may be used, and the material of each component may be selected from numerous materials other than those specifically disclosed. In short, it is the applicant's intention that the scope of the patent issuing herefrom will be limited only by the scope of the appended claims.

The invention claimed is:

1. An energy harvesting device capable of harvesting multiple forms of energy comprising:
   a base;
   a piezoelectric cantilever operatively associated with said base, said piezoelectric cantilever comprising: a piezoelectric layer disposed between and operatively associated with a first electrode and a second electrode, said first electrode operatively associated with said base, said piezoelectric layer comprising a piezoelectric material;
   a carbon nanotube film directly connected to said second electrode of said piezoelectric cantilever;
   wherein said energy harvesting device generates electrical energy when exposed to light, when exposed to thermal radiation, and when exposed to vibration energy; and wherein said piezoelectric cantilever with said carbon nanotube film self-reciprocates when exposed to light and thermal radiation.

2. The energy harvesting device of claim 1, wherein said piezoelectric cantilever comprises a proximate end and a distal end, and wherein said piezoelectric cantilever is disposed above said base such that said proximate end is supported by said base and said distal end is not supported by said base.

3. The energy harvesting device of claim 2, wherein said carbon nanotube film is disposed above said piezoelectric cantilever.

4. The energy harvesting device of claim 2, wherein said piezoelectric cantilever comprises a first broad surface, a second broad surface, and one or more interconnecting surfaces, and wherein said carbon nanotube film is disposed on said first broad surface or said second broad surface.

5. The energy harvesting device of claim 1, wherein said piezoelectric layer comprises lead zirconate titanate.

6. The energy harvesting device of claim 1, wherein said first electrode and said second electrode comprise nickel, platinum, gold, silver or chrome.

7. The energy harvesting device of claim 1, wherein said base comprises silicon, glass, or plastic.

8. The energy harvesting device of claim 1, wherein said carbon nanotube film has a thickness of approximately thirty micrometers.

9. The energy harvesting device of claim 8, wherein said energy harvesting device has a length of approximately twenty-five millimeters, a width of approximately eight millimeters, and a thickness of approximately two hundred seventy micrometers.

10. A self-powered device comprising:
    a chip;
    an energy harvesting device disposed on said chip, said energy harvesting device comprising a base, a piezoelectric cantilever operatively associated with said base, and a carbon nanotube film operatively associated with said piezoelectric cantilever; wherein said piezoelectric cantilever comprises a piezoelectric layer disposed between and operatively associated with a first electrode and a second electrode; wherein said carbon nanotube film is directly connected to said second electrode; wherein said energy harvesting device generates electrical energy when exposed to light, when exposed to thermal radiation, and when exposed to vibration energy; and wherein said piezoelectric cantilever with said carbon nanotube film self-reciprocates when exposed to light and thermal radiation;
    a power storage unit disposed on said chip, said power storage unit in electric communication with said energy harvesting device by one or more electrical connections; and
    an electronic device disposed on said chip, said electronic device in electric communication with said energy harvesting device through said power storage unit and said one or more electrical connections.

11. The self-powered device of claim 10, further comprising a rectifier disposed on said chip, said rectifier in electronic communication with said energy harvesting device, said power storage device, and said electronic device through said one or more electrical connections.

12. The self-powered device of claim 10, wherein said electronic device comprises a microsensor, a light-emitting diode, a microsystem, or a computer; and wherein said power storage unit comprises a battery.

13. The self-powered device of claim 10, wherein said energy harvesting device provides continuous power through said one or more electrical connections to said electronic device.

14. The energy harvesting device of claim 1, wherein said energy harvesting device has a length of at least one centimeter and a width of at least one centimeter.

* * * * *